(12) United States Patent
Barnes et al.

(10) Patent No.: US 6,614,701 B2
(45) Date of Patent: Sep. 2, 2003

(54) WEAK BIT TESTING

(75) Inventors: William Bryan Barnes, Bradley Stoke (GB); Robert Beat, Redland (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 10/119,636

(22) Filed: Apr. 10, 2002

(65) Prior Publication Data

US 2003/0007400 A1 Jan. 9, 2003

(30) Foreign Application Priority Data

Jun. 22, 2001 (EP) .............................. 01305427

(51) Int. Cl.[7] ................................. G11C 7/00
(52) U.S. Cl. ...................... 365/201; 365/154
(58) Field of Search ................. 365/201, 154, 365/156, 190

(56) References Cited

U.S. PATENT DOCUMENTS

| 5,255,230 A | 10/1993 | Chan et al. | |
|---|---|---|---|
| 5,361,232 A | 11/1994 | Petschauer et al. | |
| 6,501,692 B1 * | 12/2002 | Melanson et al. | 365/201 |

FOREIGN PATENT DOCUMENTS

EP  0 953 989 A2  11/1999

OTHER PUBLICATIONS

European Search Report from European priority application No. 01305427.5, filed Jun. 22, 2001.

* cited by examiner

Primary Examiner—Tan T. Nguyen
(74) Attorney, Agent, or Firm—Wolf, Greenfield & Sacks, P.C.; James H. Morris

(57) ABSTRACT

Apparatus for testing an integrated circuit, the integrated circuit comprising a plurality of semiconductor memory cells connected by a common word-line, each memory cell comprising: respective first and second transistors in cross-coupled arrangement to form a bistable latch, the drain of the first transistor representing a respective first node for storing a high or low potential state and being connected to a respective first semiconductor arrangement for replacing charge leaked from the first node and being connected to a respective first switching device, activatable by the common word-line, for coupling the respective first node to a respective first bit-line, the drain of the second transistor representing a respective second node for storing a high or low potential state and being connected to a respective second semiconductor arrangement for replacing charge leaked from the respective second node and being connected to a respective second switching device, activatable by the common word line, for coupling the second node to a respective second bit-line; and a respective individual gate arrangement having an output, and inputs connected to the respective first and second bit-lines; and the apparatus comprising a common gate arrangement having an output, and inputs connected to the outputs of the individual gate arrangements.

11 Claims, 7 Drawing Sheets

WEAK BIT TESTING

FIELD OF THE INVENTION

The present invention relates to the testing of a semiconductor memory device, more specifically to a method for testing for the presence and correct working of charge-replacing circuitry commonly found in semiconductor memory cells.

BACKGROUND OF THE INVENTION

A large number of memory cells used in modern semiconductor memory arrays include pairs of transistors, cross-coupled to form bistable latches, as illustrated in FIG. 1. Such memory cells have two nodes, N1 and N2, represented by the drains of the respective transistors, hereafter referred to as storage transistors. By selectively coupling each node to a respective bit-line ("bit", "notbit") and then taking one bit-line high and the other low, potentials can be stored on each of the nodes. More specifically, the first bit-line "bit" connected to the first node N1 may be taken high, thus taking the first node high, whilst the second bit-line "notbit", connected to the second node N2 is taken low, thus taking the second node low. It should be noted that for the bistable circuit to be in a stable state, the value stored on one node must be the logical opposite of that stored on the other node. An identical value on each node represents an unstable state.

In the following description, the convention is adopted wherein the value stored by the cell is taken to be the value stored on the first node N1. For example, if the cell has a high (sometimes referred to as a '1') stored on the first node N1, and therefore a low (sometimes referred to as a '0') stored on the second node N2, the cell may be taken to be storing a high. Using the opposite convention the same cell would be deemed to be storing a low.

If the nodes are subsequently disconnected from the bit-lines, the bistable latch circuit would ideally retain its state indefinitely. However, charge from the node storing the high may leak through the respective storage transistor to ground. This may be caused by defects in the manufacturing process used to make the circuits or may be the unavoidable result of the physics of the circuit. A common mode of leakage, other than a manufacturing defect, is charge leakage directly from the node to the ground terminal. This is due to the fact that the NMOS transistors commonly used in circuits of this type have sources and drains comprising N-type silicon which is fabricated in a P-type substrate. The NMOS sources and drains thus form P-N diodes with the substrate which are reverse biased during normal operation. These reverse biased diodes pass a small amount of current called "leakage current". Should this occur, the cell will retain its contents for a period of milliseconds or seconds but then lose its state.

To ensure that the contents of the cell will not be lost if the cell is left for a long period of time, circuitry for replacing any charge lost due to leakage is normally incorporated into the cell. Circuitry is connected between a positive voltage supply and each node of the memory cell. As charge leaks from the node, it is replaced by charge flowing through the charge-replacing circuitry (hereafter identified as CRC) from the positive voltage supply.

FIG. 1 shows a basic memory cell having no CRC. Because of charge leakage, such a cell will have no ability to retain its state for a long period of time once it is isolated from the bit-lines. The cell consists of four transistors, M1, M2, M4 and M6. M4 and M6 are the storage transistors and form the main body of the cell. Both have their sources connected to ground, and their gates and drains are cross coupled to form a bistable latch, with the drain of one connected to the gate of the other and vice versa. Nodes N1 and N2 correspond respectively to the drains of M4 and M6 and are connected, respectively, to bit-lines "bit" and "notbit" via access transistors M1 and M2. Transistors M1 and M2 have the function of coupling, respectively, nodes N1 and N2 to bit-lines "bit" and "notbit" in response to an activating signal on word-line 10. When the activating signal on word-line 10 is low, access transistors M1 and M2 are turned off, isolating the cell from bit-lines "bit" and "notbit".

FIG. 2 shows a memory cell similar to that shown in FIG. 1, but which includes CRC for replacing charge lost due to leakage. This is a six-transistor static RAM cell. In this diagram, the main body of the cell consists of four transistors, M3–M6. Transistor M4 has its drain connected to the gate of transistors M5 and M6 and to the drain of M3. Similarly, transistor M6 has its drain connected to the gate of transistors M3 and M4 and the drain of transistor M5. As before, nodes N1 and N2 corresponding, respectively, to the drains of transistors M4 and M6 are coupled to bit-lines "bit" and "notbit" respectively via access transistors M1 and M2 which are activated in response to a signal on word-line 10. M3 and M4 form an inverter, as do M5 and M6. The inverters are cross-coupled so that the output of one inverter is the input of the other, forming a bistable latch. When the cell is isolated from the bit-lines "bit" and "notbit", by turning off M1 and M2, the main body of the cell will actively retain its state. Because the cell has active feedback through the inverters in the cell, any charge lost from N1 or N2 will be replaced by the CRC connected to that node.

FIG. 3 shows a similar cell to that shown in FIG. 2, but having CRC implemented as a high value resistance in series with the storage transistors. This is known as a four-transistor static RAM cell. In the circuit shown in FIG. 3, the high value resistance takes the form of a pair of semiconductor diodes connected to each node. These diodes are connected in back-to-back arrangement, that is to say one diode is forward biased with respect to the voltage supply while the other is reverse biased with respect to the voltage supply. Thus the current passed by the diode pair is limited to the reverse saturation current of the reverse biased diode. This current is usually sufficient to replenish any charge lost due to leakage. However, the reverse biased diodes represent an effective resistance of tera-ohms to giga-ohms. Thus, the current passed by them is very small and if the charge leakage from the cell is relatively high, such a current may not be great enough to counteract the leaking charge. Furthermore, the circuit shown in FIG. 3 has the drawback that a pair of diode loads must be added to the cell, adding extra cost and complexity to the manufacturing process. Therefore, it is more common for the circuit of FIG. 2 to be used.

Often a cell is combined with many other cells to form an array comprising a plurality of columns of such cells and a plurality of rows of such cells. In an array, the cells in a column are connected via common bit-lines to allow reading and writing. The cells in a row are connected via common word-lines. The use of a cell with no CRC would cause the memory cells to fail unless a refresh circuit were coupled to counteract the effect of charge leakage every few milliseconds. This periodical charge replacement is implemented in DRAM memory cells, as is known in the art. However, there are some cases when a DRAM memory cell is not suitable, and hence an SRAM memory cell is required. In this situation, CRC provides a convenient way of ensuring that memory cells retain their state for a long period of time, by continually replacing leaked charge.

It is useful to be able to determine if the elements of the cell are functioning correctly. One test to achieve this is called the Marinescu 17N test and involves writing patterns of '0's and '1's into the cell and then reading them back and verifying them. The write part of the procedure is accomplished as outlined hereinabove, but the read part of the procedure is carried out as follows. The cell is isolated by turning off the word-line. The bit-lines are then charged to the supply voltage and the word-line is turned back on, reconnecting the bit-lines to the nodes. Charge will flow from the bit-line, through the node storing a low, through its respective storage transistor to ground. The potential on this bit-line will thus fall creating a potential difference between it and the other bit-line which will increase with time. This potential difference can be amplified by a sense amplifier and the contents of the cell can be verified. The potential on the other bit-line should not decrease with time since it is at the same potential as its respective node and thus no charge may flow through its respective access transistor. This procedure verifies the presence and correct working of the access transistors and the storage transistors, since if any are missing, the cell will be unable to store either a '1' or a '0' correctly. However, this test does not, by necessity, verify the presence and correct working of the CRC. It is important that this be done, since it is the CRC which ensures that the internal state of the cell is not lost if the cell is not accessed for a long period of time. It should be noted that if a cell with no CRC is accessed before the internal state is lost, the very act of connecting the nodes to the bit-lines in a read operation will refresh any state in the cell which has been degraded. If a cell with CRC is used, such as the cell shown in FIG. 2, and the CRC is compromised in some way, the cell reverts, either wholly, or in part, to the form of FIG. 1 and is known as a "weak bit" or, alternatively, as a cell with a data retention fault. There are two types of weak bit faults: symmetric faults, wherein the CRC on both sides of the cell fail, and asymmetric faults, wherein the CRC on only one side of the cell fails.

One test for the presence and correct functioning of the CRC is similar to the Marinescu 17N test described previously. A data pattern is written into the memory cells and then, after a long period of time, the data is read out and any discrepancies in the values of the cells are looked for. The inverse pattern is then written into the cells and the process is repeated. However, this test has a disadvantage in that a long period of time is needed to wait for any leakage effects to degrade the cell to the point where it loses its state. Since leakage is highly temperature and voltage dependent, this could take anything from between milliseconds to seconds. The total test time allocated to the testing of a typical semiconductor memory is normally approximately 2 to 3 milliseconds. The above test, however, may take several seconds to complete. Waiting for such a period of time to run only a data retention test far exceeds the budgeted test time by many orders of magnitude, thus slowing down production and increasing costs.

An alternative approach is to implement a test using a circuit called a controlled word-line driver (see Weak Write Test Mode: an SRAM Cell Stability Design for Test Technique, Anne Meixner and Jash Banik, 1996 International Test Conference Proceedings, IEEE Computer Society, IEEE Catalog No. 96CH35976, pp309–318). In this test, a voltage at an intermediate value between the ground potential and the supply potential is forced on to one of the nodes. This can be achieved by controlling the voltage level on the word-line. If the word-line is placed, for example, at half the voltage supply potential, then the voltage driven on to the node storing a high is the lower of the bit-line voltage or the voltage on the word-line minus the threshold voltage of the access transistor. When the word-line is turned off, the side of the cell storing a high will either remain at its current value because the CRC is missing or, if the CRC is working correctly, will be restored to the power supply voltage. Since the cell will have been sensitised so that it is closer to failing, the period of time needed to wait before data loss occurs is reduced. However, the implementation of such a test has disadvantages in that a separate power supply voltage is needed solely for the circuit which drives the word-line (the word-line driver). It also requires careful characterisation to determine what the best value of the word-line voltage should be to make the test successful. Also, an indeterminate period of time is still needed for leakage to occur.

It would be advantageous to have a method and associated apparatus for testing for the presence and correct working of the CRC which does not require circuitry to be added to the cell other than that shown in FIG. 2 or 3, and which can be carried out in a greatly reduced period of time.

One method which is aimed at addressing this issue is described in the applicant's co-pending application, EP 0 947 995, the contents of which are herein incorporated by reference. This method uses a sequence of operations for testing each of the two nodes of a cell. The node to be tested is set to zero potential and then allowed to "float". If the CRC is working correctly, top-up charge flows to the node, causing it to rise in potential. The change in potential is monitored by a threshold circuit, whose output changes when the potential of the node under test has risen to a certain value. If there is no change in output after a certain pre-determined time, the CRC is deemed not to be working correctly.

The method described above in EP 0 947 995 provides a satisfactory solution. However, it would be further desirable to provide a method and apparatus which allows a number of cells to be tested at once, by analysing a single output. In practice, it may be unnecessary to test each one of the cells individually as it may be more economical simply to discard the chip if it is found that any of its cells works incorrectly. The ability to test a number of cells at once would enable the testing of a chip to be carried out much more quickly than if the above-described process were repeated for each cell.

SUMMARY OF THE INVENTION

According to a first aspect of the invention, there is provided apparatus for testing an integrated circuit, the integrated circuit comprising a plurality of semiconductor memory cells connected by a common word-line, each memory cell comprising: respective first and second transistors in cross-coupled arrangement to form a bistable latch, the drain of the first transistor representing a respective first node for storing a high or low potential state and being connected to a respective first semiconductor arrangement for replacing charge leaked from the first node and being connected to a respective first switching means, activatable by the common word-line, for coupling the respective first node to a respective first bit-line, the drain of the second transistor representing a respective second node for storing a high or low potential state and being connected to a respective second semiconductor arrangement for replacing charge leaked from the respective second node and being connected to a respective second switching means, activatable by the common word line, for coupling the second node to a respective second bit-line; and a respective individual gate arrangement having an output, and inputs connected to the respective first and second bit-lines, and being arranged to provide an output of a first type when the respective first and second bit lines are both within a low potential range, and otherwise provide an output of a second type; and the apparatus comprising a common gate arrangement having an output, and inputs connected to the outputs of the individual gate arrangements, the common gate arrangement being arranged to provide an output of a first type when the inputs are all of the same type, and otherwise provide an output of a second type.

According to a second aspect of the invention, there is provided a method for testing an integrated circuit, the integrated circuit comprising a plurality of semiconductor memory cells connected by a common word-line, each memory cell comprising respective first and second transistors in cross-coupled arrangement to form a bistable latch, the drain of the first transistor representing a respective first node for storing a high or low potential state and being connected to respective first semiconductor arrangement for replacing charge leaked from the first node and being connected to a respective first switching means, activatable by the common word-line, for coupling the first node to a respective first bit-line, the drain of the second transistor representing a respective second node for storing a high or low potential state and being connected to a respective second semiconductor arrangement for replacing charge leaked from the second node and being connected to a respective second switching means, activatable by the common word line, for coupling the second node to a respective second bit-line, the method comprising the steps of: applying each respective first and second bit-lines to a respective gate arrangement having an output; activating the common word-line to connect the first node of each cell to its respective first bit-line to allow any potential on the first node of each cell to fall towards the potential on the respective first bit-line, by means of charge flowing from each first node to the first bit-line, the respective gate arrangement being arranged to provide an output signal of a first type when the first bit line and the second bit line are both within a same potential range, and being arranged to provide an output signal of a second type when the first bit line and the second bit line are within different potential ranges; applying the outputs of the gate arrangements as inputs to a common gate arrangement arranged to provide an output signal of a first type when all the inputs are within a same potential range, and arranged to provide an output signal of a second type when any of the inputs is within a potential range which is different from that of any of the other inputs.

Preferred aspects of the invention are set out in the dependent claims.

BRIEF DESCRIPTION OF THE DRAWINGS

The invention will now be described, by way of example only, with reference to the accompanying drawings in which.

In the figures, like reference numerals indicate like parts.

DESCRIPTION OF PREFERRED EMBODIMENTS OF THE INVENTION

Figure 1:
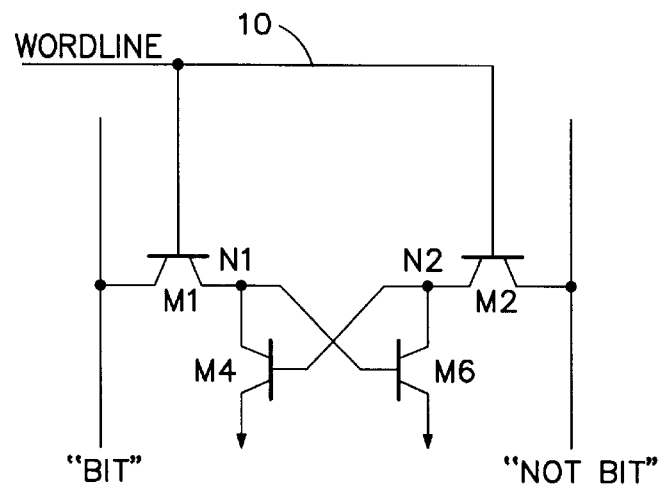
FIG. 1 shows a basic four-transistor memory cell having no CRC.
Figure 2:
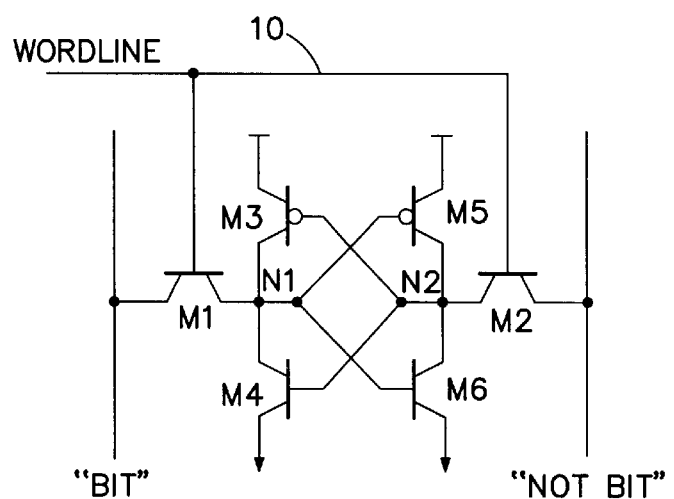
FIG. 2 shows a similar four-transistor memory cell having CRC in the form of transistors.
Figure 3:
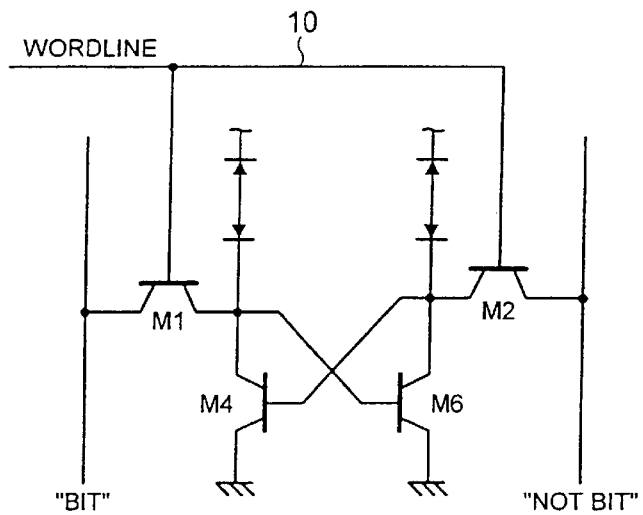
FIG. 3 shows a similar four-transistor memory cell having CRC in the form of high value resistance.
Figure 4:
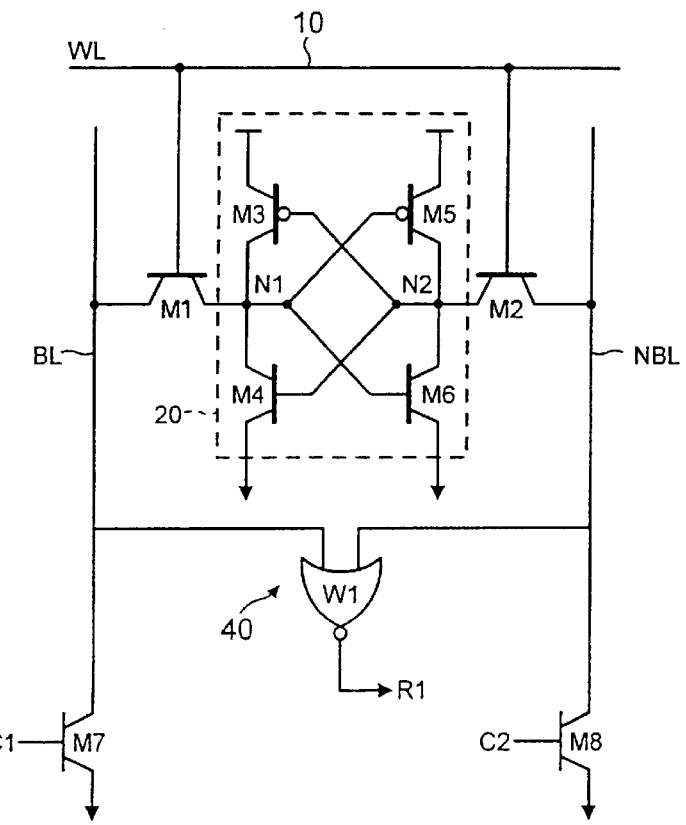
FIG. 4 shows a four-transistor memory cell of the type shown in FIG. 2 and testing circuitry for monitoring the flow of charge from the node to the bit-line.

FIG. 4 shows a memory cell of the type shown in FIG. 2, and additionally, two transistors M7, M8 for activating the bit line BL and the not bit line NBL. There is also provided a threshold circuitry 40 for monitoring the flow of charge from the nodes to the bit lines, as will be explained below.

This test aims to find whether the CRC is present and working correctly. Generally, before the test commences, the cell will be storing a value; that is to say that (referring to FIG. 4) nodes N1 and N2 will be at logically opposite potentials. This is achieved in the conventional manner by taking one bit-line high and the other bit-line low and then turning on the word-line to connect the bit-lines to the nodes. In this case, the PMOS transistor (M3 or M5) connected to the node storing a high will be on while that connected to the node storing a low will be off. (It is possible for the cell not to be storing a value, with both nodes low). Once a value has been written, the word-line is deactivated and, if the CRC is present and functioning correctly, the cell retains its state. It should be noted, however, that the contents of the cell prior to the commencing of the test are irrelevant. Therefore, any suitable sequence of operations which leaves the bit-lines in the required state (i.e. one high, the other low) may be used. It may be the case that a more complicated sequence than the one described below is most suitable in a particular circumstance.

Referring more specifically to FIG. 4, if it is desired to test the CRC of the cell, each transistor M4, M6 is tested individually. In order to test transistor M6 of a single cell, a set-up procedure is first performed, as indicated in the previous paragraph. The bit-lines are firstly coupled to a low potential via transistors M7 and M8, by activating M7, M8 with signals C1, C2. Then, M7 is activated whilst M8 remains de-activated, and the word line WL1 10 is subsequently activated. This results in a 1 being written to node N1 and a 0 being written to N2.

Following the above set-up procedure, the test itself is carried out. Both bit-lines are held low and the word-line 10 is activated, turning on access transistors M1 and M2 and reconnecting the nodes N1, N2, to the bit-lines.

When this occurs, there is no change in the state of the node N2 storing a low since the not bit line NBL is also at a low. However, on the other side of the cell, charge will start to flow from the node N1 storing a high, through its respective access transistor M1 and on to the bit-line BL. The potential on this node N1 consequently falls towards a value near to the low potential of the bit-line. The drop in potential on this node causes the PMOS transistor M5 to the other node N2 to turn on. Thus, both PMOS transistors M3 and M5 are on. It can be seen that, as stated above, the contents of the cell prior to commencing the test is irrelevant since the connecting of the nodes to the bit-lines which are held at a low potential erases any prior cell contents.

If the CRC for the N2 side of the cell is not working correctly, the charge flow from the node N2 on to the not bit-line NBL will fall to zero almost instantaneously and will not rise. However, if the respective CRC is functioning correctly, charge supplied from the voltage supply through the CRC will continue to flow from the node N2 on to NBL. By monitoring this charge flow from the node on to the bit-line NBL, it is possible to establish if the CRC is working correctly.

In the preferred embodiment, the method of monitoring this charge flow is achieved by disconnecting the bit-line NBL from the low potential and allowing it to 'float', i.e. allowing it to be influenced by the CRC in the memory cell. Thereafter the potential on the disconnected bit-line is measured. If the CRC is working correctly, the potential on the bit-line NBL will rise. Furthermore, the potential on NBL will rise at a rate dependent on how well the CRC is working, thus making it possible to grade the functionality of the CRC. In this instance, timing circuitry can be employed to determine the time taken for the potential on the disconnected bit-line to rise to the predetermined level. If the potential on the bit-line reaches the predetermined level within a predetermined period of time, the CRC is deemed to be fully working. If the potential on the bit-line does not reach the predetermined level within the predetermined period of time, the CRC is deemed not to be fully working and the time taken for the predetermined level to be reached indicates the extent of the failure of the CRC. If the potential on the bit-line NBL does not reach the predetermined level after any length of time, the CRC is deemed to have failed completely.

To determine the predetermined potential level described above, threshold circuitry can be employed which can take the form of the threshold circuitry 40 illustrated in FIG. 4. This circuitry comprises merely a NOR gate W1 having as inputs BL and NBL. The truth table for the NOR gate is as follows:

| Inputs | | |
|---|---|---|
| BL | NBL | Output (R1) |
| 0 | 0 | 1 |
| 0 | 1 | 0 |
| 1 | 0 | 0 |
| 1 | 1 | 0 |

When NBL is floated, both inputs to the NOR gate are 0, which means that the output R1 is 1. From the table it can be seen that if both inputs are zero the output is 1, and this is the only combination of inputs which produces an output of 1. This means that the NOR gate can be used to identify whether the CRC is working, because if it is not working, the rise in potential described above will not occur. This in turn means that NBL remains at potential 0 and since BL is also at zero, both inputs remain at zero, making the output R1 1. If, on the other hand the CRC is working, the potential at N2 will rise to a potential of 1 as charge flows from the CRC, and hence the output R1 will change to zero. If N1 were being tested, the same situations would produce the same outputs. The timing circuitry can be connected to R1 to measure the time taken for the output to fall to zero after NBL is floated. It can be appreciated that this arrangement is advantageous because it requires monitoring of a single output R1.

Figure 5:
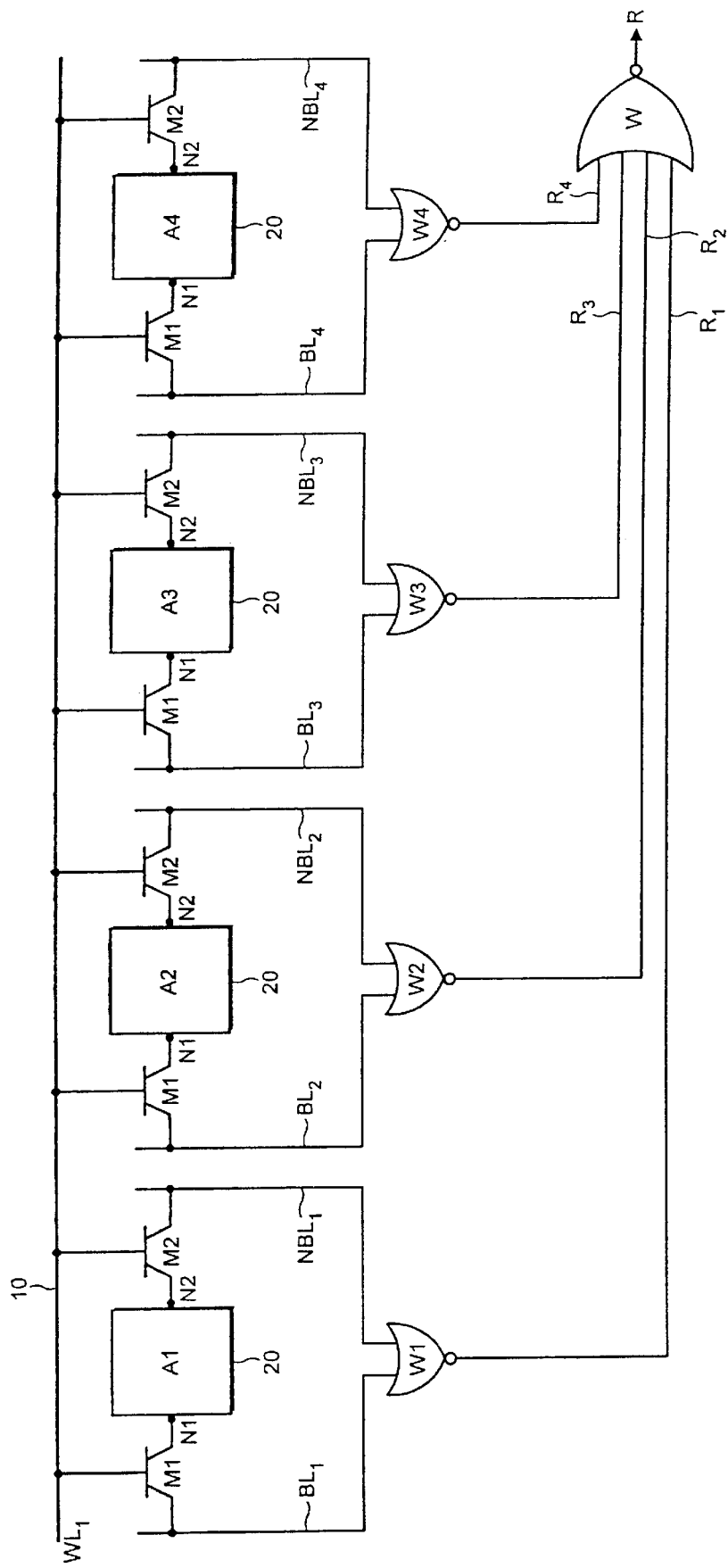
FIG. 5 shows a number of four-transistor memory cells of the type shown in FIG. 2 and testing circuitry for monitoring the flow of charge from the nodes to the bit-line.

FIG. 5 shows how the above-described test can be implemented to test a number of the cells of FIG. 2 together at the same time. It can be seen in FIG. 6 that four cells are connected by a common word line WL1 10. Four cells are shown for convenience, but the embodiment is not limited to four cells. The cells are shown as "black boxes" 20, which represent the components within the dotted line 20 shown in FIG. 4. The cells are numbered A1, A2, A3, A4. Cell A1 is connected to bit line BL1 and not bit line NBL1. Similarly, cell A2 is connected to BL2 and NBL2, cell A3 is connected to BL3 and NBL3, and cell A4 is connected to BL4 and NBL4. BL1 and NBL1 provide inputs to NOR gate W1, which has an output R1. Similarly, BL2 and NBL2 provide inputs to NOR gate W2 which has an output R2, BL3 and NBL3 provide inputs to NOR gate W3, which has an output R3, and BL4 and NBL4 provide inputs to NOR gate W4, which has an output R4. The outputs R1–R4 form inputs to some further circuitry. This could be a further NOR gate arrangement as shown diagrammatically as NOR gate W having output R in FIG. 5 and hence maintaining the advantage of having a single output to monitor. The further circuitry could be a ratio logic circuit.

The test is carried out in a similar manner as described above, but the manipulation of the bit line BL1 is done at the same time to all bit lines BL2–BL4. Similarly, the manipulation of the not bit line NBL1 is done at the same time to all not bit lines NBL2–NBL4. Because the word line WL 10 is common to all cells, the manipulation of it has the same effect on each cell. Thus it can be appreciated that the outputs R1–R4 represent the working or not working of the CRCs of cells A1–A4 respectively. It can further be appreciated that if it is desired merely to determine whether any one of the cells A1–A4 has a faulty CRC, by connecting the four outputs R1–R4 to circuitry as represented by NOR gate W, the output R of NOR gate W can be interpreted in a similar way as the output W1 of the single cell is interpreted as described above. In other words, if any of the cells A1–A4 has a faulty CRC, its respective output will not change to zero, which in turn results in the output R remaining at potential 1, indicating a faulty CRC in one of the cells. If, on the other hand, all the cells are functioning correctly, soon after the BLs or NBLs (depending whether nodes N1 or N2 are being tested) are floated, the output R will return to 0.

Figure 6:
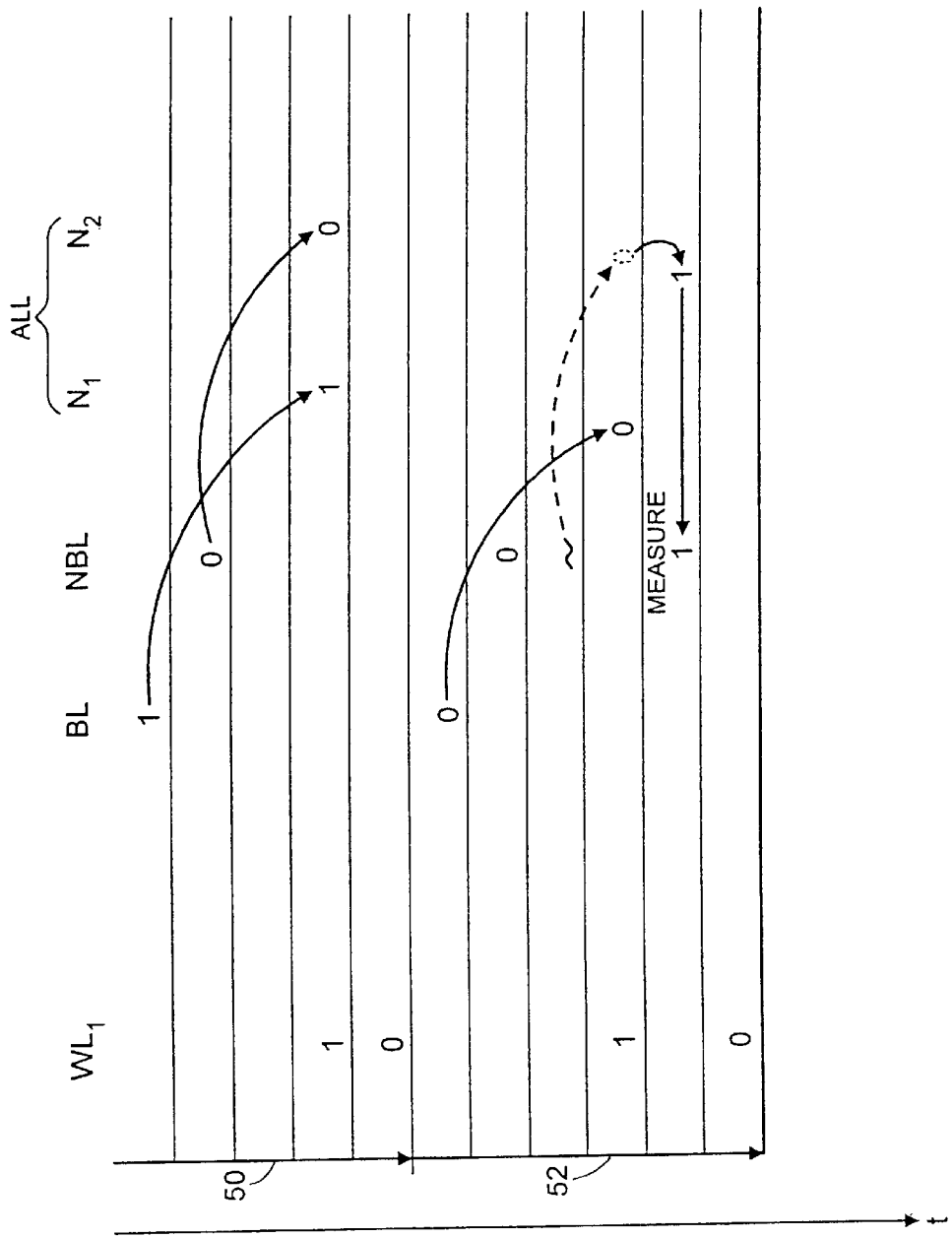
FIG. 6 is a diagrammatic representation of the sequence of steps used to test the arrangement of FIG. 4.

The test sequence for testing nodes N2 is shown in FIG. 6. A time line t runs down the page. The pre-test set-up is shown by arrow 50. This covers the steps of setting the bit lines BL1–BL4 to 1, resulting in the nodes N1 being set at 1, and setting the not bit lines NBL1–NBL4 to 0, resulting in the nodes N2 being set at 0. It also covers the step of activating the word line WL 10 (indicated by a value of 1) to turn on the access transistors M1 and M2, followed by de-activating WL 10 (indicated by a 0).

The test itself is shown by arrow 52. The bit lines BL1–4 and the not bit lines NBL1–4 are held at 0. The word line WL 10 is then activated, turning on access transistors M1 and M2 and reconnecting the nodes N1, N2, to the bit-lines.

When this occurs, there is no change in the state of the nodes N2 storing a low since the not bit lines NBL1–NBL4 are also at a low. However, on the other side of the cells, charge will start to flow from the nodes N1 storing a high, through their respective access transistors M1 and on to their respective bit-lines BL1–BL4. The potential on the nodes N1 consequently falls towards a value near to the low potential of the bit-lines BL1–BL4, as indicated by a 0. The drop in potential on the nodes N1 causes the PMOS transistor M5 to the other nodes N2 to turn on. Thus, both PMOS transistors M3 and M5 (which are of course within each cell but not visible in FIG. 5) are on.

If the CRC for the N2 side of any of the cells A1–A4 is not working correctly, the charge flow from the node N2 of that cell on to its respective not bit-line NBL will fall to zero almost instantaneously and will not rise. However, if the respective CRC is functioning correctly, charge supplied from the voltage supply through the CRC will continue to flow from the node N2 on to NBL. In this embodiment, the not bit lines NBL1–NBL4 are floated as represented by "~". Thus the potential at nodes N2 is 0 for a short time until the CRC begins to supply charge, at which point the potential rises, as shown by dotted and wavy arrows. By monitoring this charge flow from the node on to the bit-line NBL, by measuring the potential of NBL, it is possible to establish if the CRC is working correctly. This of course is done by the NOR gates W1–W4 and the circuitry represented by NOR gate W or similar.

This operation is then repeated in corresponding fashion for the nodes N1.

Thus it can be seen that the invention provides a quick way of testing a number of memory cells in order to determine within an acceptable time frame whether or not a chip containing such memory cells is functioning or not, since fewer cycles are required than in some prior art arrangements.

It is likely that on a chip containing a number of memory cells, the cells will not be arranged having a common word line. However, the above-described embodiment can be adapted for this situation, as shown by the circuitry of FIG. 7.

Figure 7:
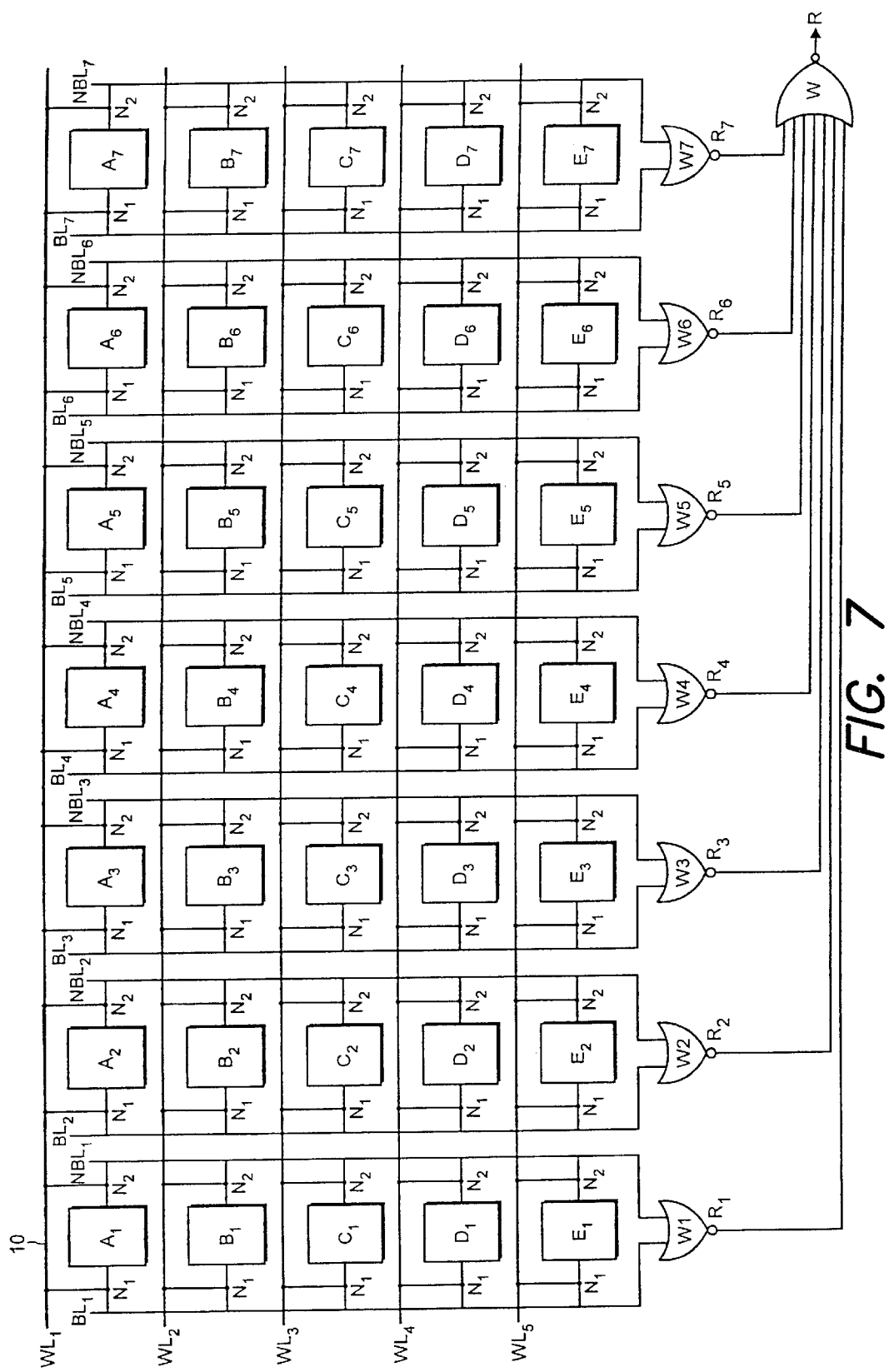
FIG. 7 shows circuitry comprising a number of arrangements as shown in FIG. 4, each arrangement having it own word line.

FIG. 7 incorporates the components of FIG. 5, but indicates how the number of memory cells connected to word line WL1 can be increased. The figure shows seven such cells, but on a chip there would usually be a lot more. FIG. 7 also shows four more word lines WL2, WL3, WL4, WL5, which each also have seven memory cells connected to them. Thus each word line can be considered to be capable of activating the group of memory cells connected to it, these groups being indicated by letters A to E in FIG. 7, each group having numbers 1–7. It can also be seen in FIG. 8 that the memory cells having the same numbers are connected to the same bit lines and not bit lines. Thus, for example, cells A1, B1, C1 . . . E1 are all connected to WL1 and cells A2, B2, C2 . . . E2 are all connected to BL2 and NBL2. The remaining cells are arranged similarly.

Figure 8:
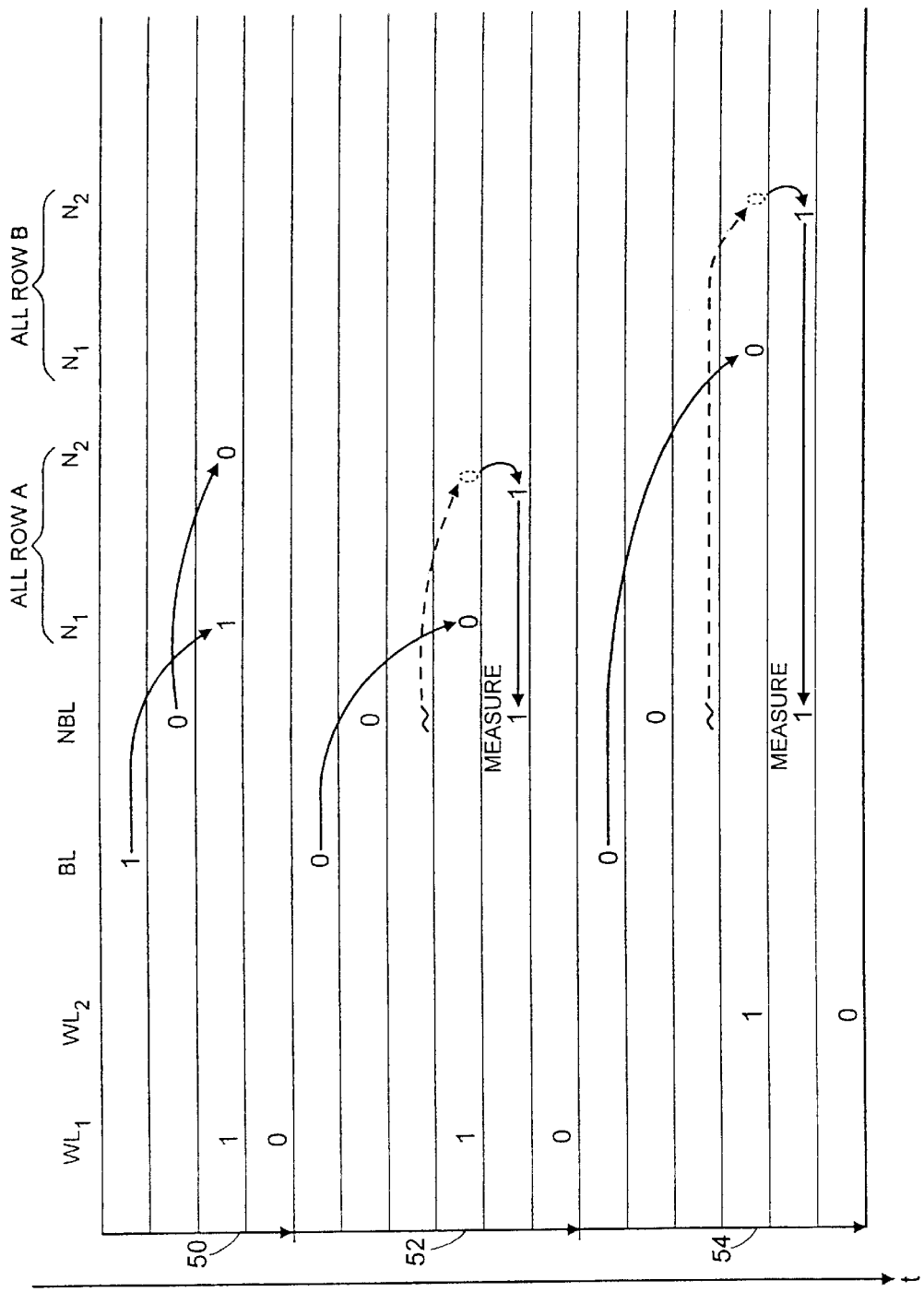
FIG. 8 is a diagrammatic representation of part of a sequence of steps used to test the arrangement of FIG. 7.

In order to test the chip of FIG. 7, the same procedure as described in respect of FIG. 5 is carried out for cells A1–A7. After this, it is then possible to repeat the test for cells B1–B7, by virtue of the fact that they are connected to the same respective bit lines as cells A1–A7. This test sequence is illustrated in FIG. 8, which is the same as FIG. 6, but additionally shows the test on cells B1–B7, labelled by arrow 54. Similar subsequent tests would be performed for groups C1–C7 and the remaining groups. It can be understood that the method and apparatus described provides the advantage that it is not necessary to repeat the set-up part of the test in order to test other groups of cells and hence fewer cycles are required than in some prior art arrangements. Therefore the invention provides a time saving over other methods of testing chips. The single output W is monitored for each group of cells, and if any group is found to have a defective cell, the chip can be discarded.

This operation is then repeated in corresponding fashion for the nodes N1.

Figure 9:
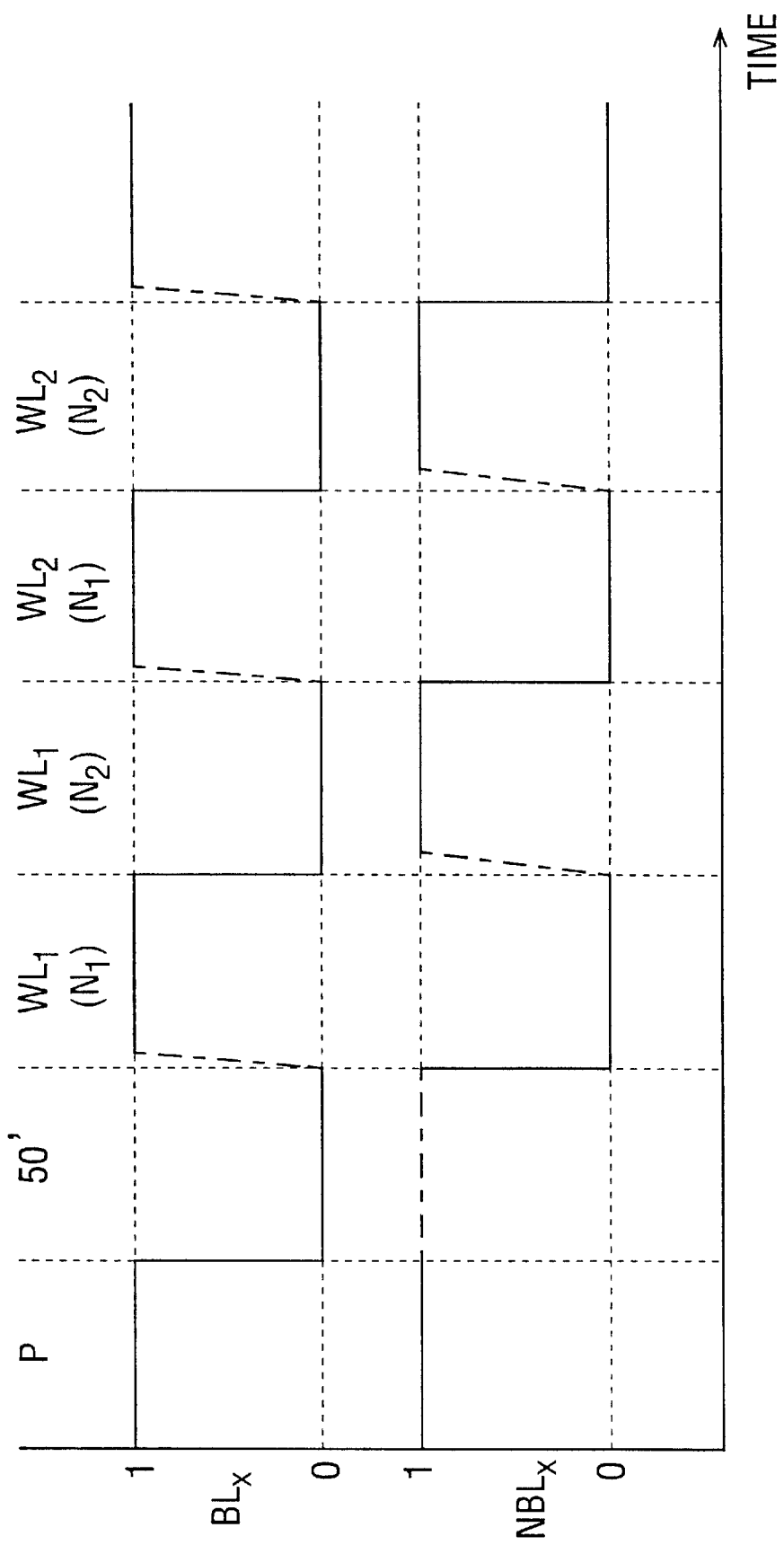
FIG. 9 is an alternative diagrammatic representation of part of an alternative sequence of steps used to test the arrangement of FIG. 7.

By way of further explanation of testing the chip of FIG. 7, an alternative test sequence is partially represented in FIG. 9. This figure shows a time-line running horizontally across the page, together with representations of the states of BL and NBL. The terms "$BL_x$ and $NBL_x$" mean that the representations of the states represent the states of all the bit-lines and not bit-lines shown in FIG. 7 (and any extension of FIG. 7).

Time period P represents the default, inactive state. This stage is not shown on FIG. 6 or 8, but is an alternative to the set-up procedure 50, in that it sets $BL_x$ and $NBL_x$ in the required initial state.

Time period 50' represents initialisation in which $BL_x$ is set to 1 and $NBL_x$ is allowed to float. At the start of time period $WL_1$ ($N_1$), $NBL_x$ is set to 0 and $BL_x$ is allowed to float. The chained line shows how $BL_x$ then gradually rises up to 1, indicating that the CRC is working correctly to bring N1 up to high potential.

At the start of the next time period $WL_1$ ($N_2$), $BL_x$ is set to 0 and $NBL_x$ is allowed to float. The chained line shows how $NBL_x$ then gradually rises up to 1, indicating that the CRC is working correctly to bring N2 up to high potential. At this stage, referring to FIG. 7, the CRCs of both nodes N1 and N2 of all cells A1–A7 have been tested. The sequence is then repeated for all cells B1–B7 as shown by time periods $WL_2$ ($N_1$) and $WL_2$ ($N_2$). The sequence is then repeated for all the remaining wordlines, which in FIG. 7, means testing all cells C, D and E.

Thus the difference between the test sequence shown in FIG. 8 and the test sequence shown in FIG. 9 is that the sequence of FIG. 8 tests all nodes N2 of all wordlines followed by all nodes N1 of all wordlines, whereas the sequence shown in FIG. 9 tests nodes N1 and N2 of WL1, followed by nodes N1 and N2 of WL2 and so on for all words. However, FIG. 9 emphasises the small number of cycles required to perform the test, regardless of whether the order of nodes tested is in accordance with FIG. 8 or FIG. 9.

To selectively couple bit-lines "bit" and/or "notbit" to the low potential in order to perform the method of the invention described hereinabove, switching circuitry (30), as illustrated in FIG. 5 of the applicant's co-pending European patent application EP 0 947 995 can be used. The method of operation of this switching circuitry is explained in this application. Conventional write driver circuitry can also be used.

It will be understood that the above description is not intended to limit the invention in any way, the scope of which is set out in the appended claims. The present invention may include any feature or combination of features disclosed herein either implicitly or explicitly together or in isolation, or any generalisation thereof irrespective of whether it relates to the presently claimed invention. In view of the foregoing description it will be evident to a person skilled in the art that various modifications may be made within the scope of the invention.

What is claimed is:

1. Apparatus for testing an integrated circuit, the integrated circuit comprising a plurality of semiconductor memory cells connected by a common word-line, each memory cell comprising:

respective first and second transistors in cross-coupled arrangement to form a bistable latch, the drain of the first transistor representing a respective first node for storing a high or low potential state and being connected to a respective first semiconductor arrangement for replacing charge leaked from the first node and being connected to a respective first switching means, activatable by the common word-line, for coupling the respective first node to a respective first bit-line, the drain of the second transistor representing a respective second node for storing a high or low potential state and being connected to a respective second semiconductor arrangement for replacing charge leaked from the respective second node and being connected to a respective second switching means, activatable by the common word line, for coupling the second node to a respective second bit-line; and a respective individual gate arrangement having an output, and inputs connected to the respective first and second bit-lines, and being arranged to provide an output of a first type when the respective first and second bit lines are both within a low potential range, and otherwise provide an output of a second type; and the apparatus comprising a common gate arrangement having an output, and inputs connected to the outputs of the individual gate arrangements, the common gate arrangement being arranged to provide an output of a first type when the respective first and second bit lines are both within a low potential range, and otherwise provide an output of a second type.

2. Apparatus according to claim 1, wherein the respective individual gate arrangements are NOR gates.

3. Apparatus according to claim 1, wherein the common gate arrangement of the integrated circuit provides an output whose value is indicative of the correct functioning of the first or second semiconductor arrangements.

4. Apparatus according to claim 1, wherein the common gate arrangement is a NOR gate arrangement.

5. Apparatus according to claim 4, wherein the NOR gate arrangement is a ratio logic circuit.

6. Apparatus according to claim 1, comprising control circuitry for initiating a testing operation by storing a low potential state on the first node and then allowing the second bit line to rise under the influence of the second semiconductor arrangement.

7. Apparatus according to claim 6, comprising timing circuitry for providing a timed output indicative of whether the output of the common gate arrangement remains of the first type for longer than the first predetermined length of time after the bit line is allowed to float.

8. Apparatus according to claim 1, wherein each first semiconductor arrangement comprises a PMOS transistor.

9. Apparatus according to claim 1, wherein each first semiconductor arrangement comprises a pair of diodes.

10. Apparatus according to claim 1, additionally comprising:

one or more further word-lines;

further semi-conductor memory cells arranged in one or more groups, each further cell having respective first and second transistors in cross-coupled arrangement to form a bistable latch, the drain of the first transistor representing a respective first node for storing a high or low potential state and being connected to a respective first semiconductor arrangement for replacing charge leaked from the first node and being connected to a respective first switching means, activatable by one of the further word-lines, for coupling the respective first node to a respective first bit-line, the drain of the second transistor representing a respective second node for storing a high or low potential state and being connected to a respective second semiconductor arrangement for replacing charge leaked from the respective second node and being connected to a respective second switching means, activatable by the same further word-line, for coupling the second node to a respective second bit-line; and, wherein, all the cells in each group are activatable by the same respective further word-line and the groups are arranged such that each cell in a group is coupled to different respective first and second bit-lines, such that each first and second bit-line is coupled to one cell from each group and such that at any given time, each respective gate arrangement is arranged to provide outputs of a first or second type in dependence on inputs from the cell belonging to the group whose word-line is being activated and which is connected to the same respective first and second bit-lines as the respective gate arrangement, wherein, at any given same time, the common gate arrangement provides outputs of a first or second type from inputs provided by respective gate arrangements of one group.

11. A method for testing an integrated circuit, the integrated circuit comprising a plurality of semiconductor memory cells connected by a common word-line, each memory cell comprising:

respective first and second transistors in cross-coupled arrangement to form a bistable latch, the drain of the first transistor representing a respective first node for storing a high or low potential state and being connected to respective first semiconductor arrangement for replacing charge leaked from the first node and being connected to a respective first switching means, activatable by the common word-line, for coupling the first node to a respective first bit-line, the drain of the second transistor representing a respective second node for storing a high or low potential state and being connected to a respective second semiconductor arrangement for replacing charge leaked from the second node and being connected to a respective second switching means, activatable by the common word line, for coupling the second node to a respective second bit-line, the method comprising the steps of:

applying each respective first and second bit-lines to a respective gate arrangement having an output;

activating the common word-line to connect the first node of each cell to its respective first bit-line to allow any potential on the first node of each cell to fall towards the potential on the respective first bit-line, by means of charge flowing from each first node to the first bit-line, the respective gate arrangement being arranged to provide an output signal of a first type when the first bit line and the second bit line are both within a same potential range, and being arranged to provide an output signal of a second type when the first bit line and the second bit line are within different potential ranges;

applying the outputs of the gate arrangements as inputs to a common gate arrangement arranged to provide an output signal of a first type when all the inputs are within a same potential range, and arranged to provide an output signal of a second type when any of the inputs is within a potential range which is different from that of any of the other inputs.

* * * * *